United States Patent [19]

Sanders et al.

[11] Patent Number: 4,755,450
[45] Date of Patent: Jul. 5, 1988

[54] SPECTRAL SENSITIZING DYES IN PHOTOPOLYMERIZABLE SYSTEMS

[75] Inventors: James F. Sanders, St. Joseph Township, St. Croix County, Wis.; David B. Olson, Marine on St. Croix, Minn.

[73] Assignee: Minnesota Mining and Manufacturing Company, St. Paul, Minn.

[21] Appl. No.: 854,851

[22] Filed: Apr. 22, 1986

[51] Int. Cl.$^4$ ................................................. G03C 1/68
[52] U.S. Cl. ..................... 430/285; 430/281; 430/286; 430/287; 430/914; 430/926; 430/915; 430/916; 430/919; 430/920; 522/8; 522/9; 522/10; 522/14; 522/15; 522/16; 522/25; 522/28; 522/34; 522/39

[58] Field of Search ............... 430/281, 914, 926, 915, 430/916, 286, 287, 919, 920, 285; 522/9, 10, 8, 14, 15, 16, 25, 26, 28, 34, 39

[56] References Cited

U.S. PATENT DOCUMENTS

| | | | |
|---|---|---|---|
| 3,549,367 | 12/1970 | Chang et al. | 430/281 X |
| 3,652,275 | 3/1972 | Baum et al. | 430/281 X |
| 3,844,790 | 10/1974 | Chang et al. | 430/281 |
| 4,507,497 | 3/1985 | Reilly, Jr. | 522/15 |

*Primary Examiner*—Paul R. Michl
*Assistant Examiner*—Cynthia Hamilton
*Attorney, Agent, or Firm*—Donald M. Sell; James A. Smith; Mark A. Litman

[57] ABSTRACT

Spectral sensitizing dyes which sensitize photoinitiators and disperse in aqueous solutions are desirable in photosensitive systems where precise color rendition is important.

10 Claims, No Drawings

SPECTRAL SENSITIZING DYES IN PHOTOPOLYMERIZABLE SYSTEMS

BACKGROUND OF THE INVENTION

1. Field of the Invention

The present invention relates to spectral sensitizing dyes. Photobleachable dyes particularly useful for the spectral sensitization of photoinitiators and photosolubilizers.

2. Background of the Art

Many different classes of compounds have natural sensitivities to various wavelengths of the electromagnetic spectrum. For example, various silver halide crystals are sensitive to ultraviolet radiation and short wavelengths of blue light, diazonium salts and diazo oxides are sensitive to ultraviolet radiation, iodonium and sulfonium salts are sensitive to ultraviolet radiation, and many other classes of photoinitiators such as s-triazines, bisimidazoles, etc. have natural sensitivities to narrow bands of radiation within the electromagnetic spectrum. Without the ability to expand these natural or inherent ranges of sensitivity, many imaging processes would not be useful.

Fortunately, most photosensitive materials can have their natural range of spectral sensitivity expanded. This can be done either by modification of the material itself or by the addition of a spectral sensitizing dye. The spectral sensitizing dyes generally are believed to function by absorbing radiation and transferring energy to the photosensitive material. Silver halide emulsions are conventionally sensitized to different portions of the spectrum (e.g., U.S. Pat. Nos. 3,936,308; 3,758,461) as are dry silver constructions (e.g., U.S. Pat. Nos. 4,476,220; 4,461,828), dye bleach and leuco dye oxidation systems (e.g., U.S. Pat. Nos. 4,460,677; 4,386,154; 4,373,020; 4,343,891) and positive and negative resist systems (e.g., U.S. Pat. Nos. 4,476,215; 4,571,374; 4,571,373).

Spectral sensitizers may often have different performance requirements depending upon the use of the final product. In black-and-white negative acting graphic arts film where unexposed areas are removed to form the final image, the sensitizing dye may remain in the final image where it is essentially overwhelmed by the density of the black image. In printing or proofing environments, where exact color renditions are essential and a range of color densities is necessary, the presence of residual colored sensitizing dye can adversely effect the quality of the image. In wet processed silver halide systems, it is often desirable to use alkaline solution bleachable sensitizing dyes. In thermally developed imaging systems it is desirable to use thermally bleachable sensitizing dyes. In these and other imaging systems, photobleachable dyes are highly desired.

U.S. Pat. No. 3,729,313 describes various classes of spectral sensitizing dyes useful in the sensitization of diaryliodonium light-sensitive compounds. The specific classes of dyes described there are useful sensitizers, but tend to be difficult to photobleach and the products of the bleach process are often themselves colored. Furthermore, the dyes tend to be migratory which can lead to speed variations and unpredictable staining problems.

SUMMARY OF THE INVENTION

The use of aminoarylketone spectral sensitizing dyes as spectral sensitizers for photosensitive compounds provides efficient sensitization, ease of photobleaching and solubility in developer solutions.

DETAILED DESCRIPTION OF THE INVENTION

Aminoarylketones have been found to be photobleachable spectral sensitizing dyes which are soluble in developed solutions and therefore removable from photopolymerized compositions. These dyes have been found to be particularly efficient in sensitizing photopolymerization, photodepolymerization, and photosolubilization reactions. The dyes are particularly useful when they are soluble in aqueous alkaline solutions of pH greater than 7.5 since they will tend to be leached out of polymerizable and polymerized compositions by aqueous alkaline developers. This helps prevent any possibility of background staining.

The preferred class of aminoarylketones may be represented by the formulae

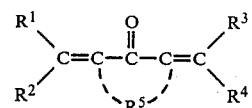

or

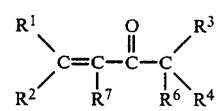

wherein
$R^1$, $R^2$, $R^3$, $R^4$, and $R^6$ are independently selected from hydrogen, alkyl (substituted or not substituted), aryl (substituted or not, e.g., phenyl, naphthyl), or 5- or O-membered heterocyclic (e.g., containing only C, N, S, Se, or O ring atoms), $R^5$ represents the atoms necessary to complete a 5-, 7-, or 6-membered ring comprising only C, N, S, Se, or O ring atoms, with no more than two ring atoms being other than carbon, further characterized by the fact that at least one of $R^1$ through $R^7$ has a carboxylic acid group (including salts or aqueous hydrolyzable esters in either basic or acid solutions, depending upon the pH of the developer thereof) and at least one of $R^1$, $R^2$, $R^3$, $R^4$, or $R^6$ is an aromatic group having a dialkylamino, diarylamino, or alkylarylamino substituent of up to 20 carbon atoms per alkyl or alkyl group. Preferably any alkyl substituent is a lower alkyl substituent, with each alkyl group having 1 to 4 carbon atoms. Preferably the aromatic (i.e., aryl) group has up to 10 ring carbon atoms and is most preferably phenyl.

Examples of particularly useful groups formed by $R^5$ include 5-, 6-, or 7- membered non-aromatic, carboxylic and heterocryclic rings, but are not limited to

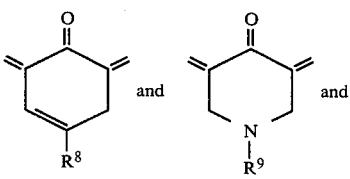

-continued

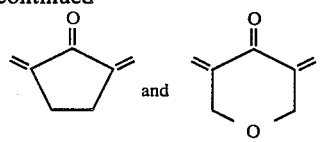
and wherein R⁸ is selected from hydrogen, alkyl, alkoxy, aryl, halogen, etc. and R⁹ is selected from alkyl (preferably 1 to 4 carbon atoms), carboxy aliphatic (e.g.,

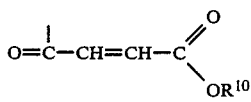

wherein R¹⁰ is selected from hydrogen, alkyl, and cations). It is also useful and desirable for the required aromatic substituents to include the carboxy function in the form

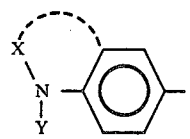

wherein X is either an aliphatic group or the atoms necessary to complete a fused ring structure with the phenyl group and Y is a carboxyl containing moiety. Exemplary structures of dyes of the present invention are

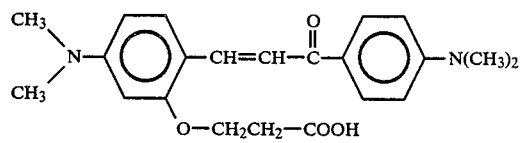

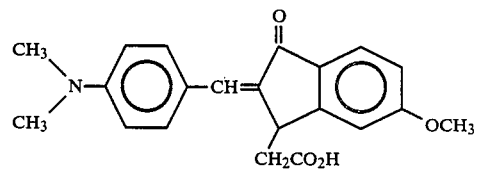

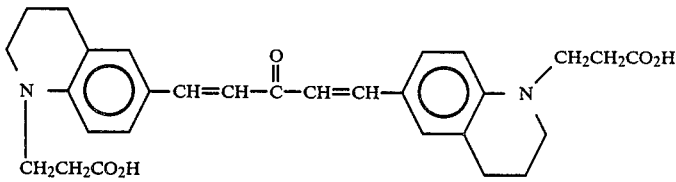

These dye structures show that the required carboxylic acid functionality of the present invention may be variously located within the dye molecule. These particular examples show the carboxylic acid functionality on (1) the aryl group in resonance with the keto group, (2) the bridging moiety R⁵, and (3) on the dialkylamino group itself. The carboxylic acid functionality may be attached to bridging methylene group (e.g., R⁷) or on other bridging moieties as shown in Example 5 where the carboxylic acid group is attached to a piperidone bridging group. If arylamino groups are used, the carboxylic acid groups would likewise be substituted on those aryl groups.

The sensitizing dyes of the present invention are believed to be useful in conjunction with all free radical photoacid sensitators including photoinitiators, photodepolymerizers and photosolubilizers. They have been found to be particularly useful with such photoinitiators as the s-triazines and vinylhalomethyl s-triazines (e.g., U.S. Pat. Nos. 3,954,475 and 3,987,037), onium photoinitiators, particularly iodonium and sulfonium photoinitiators (e.g., U.S. Pat. Nos. 3,729,313; 3,887,450; 3,895,949; 4,043,819; 4,058,400; 4,058,401 and 4,250,053), and biimidazoles (e.g., biimidazoyls as taught in U.S. Pat. No. 4,162,162).

These spectrally sensitized photosensitive compounds may be used in a wide variety of compositions and products. They are preferably used in negative-acting photopolymerizable compositions where the photoinitiated decomposition product is a free radical capable of initiating polymerization of vinyl groups. Such systems generally employ acryloyl and methacryloyl functional materials in a composition. Such compositions generally comprise 10–100% by weight (preferably 10–90% by weight) of free radical polymerizable materials (e.g., ethylenically unsaturated monomers, oligomers, and/or polymers, e.g., U.S. Pat. Nos. 4,323,591; 4,510,593; 4,304,923; 4,306,954; and 4,228,232), 0–75% by weight (preferably 10–60% by weight) of a film-forming binder, and 0.3 to 12% by weight of the free radical photoinitiation system (the weight of sensitizing dye and photoinitiator, combined). Additional additives such as pigments and dyes (either colored, black or white), matting agents (inorganic or polymeric), surfactant, ultraviolet radiation absorbers, coating aids, and the like may be added as desired.

Many of these photoinitiators are useful in the polymerization of other free radical systems (e.g., vinyl, vinyl methyl ethers) and some of the photoinitiators are useful in the initiation of cationically polymerizable systems such as epoxy resins and silanes. This use of photoinitiators is shown for example in U.S. Pat. Nos. 4,058,401; 4,250,053; 4,101,513; and 4,069,054).

Preferred photopolymerizable compositions useful with the dyes of the present invention may be described as follows.

The compositions comprise 10-60% by weight of polyfunctional monomers, 10-60% by weight of polyfunctional polymers or oligomers, 0-60% or 10-60% by weight of a polymer which is not polymerizable in the polymerization process of the monomers and oligomers, and 0.1 to 20% by weight of a photoinitiator system (e.g., 0.05 to 16% photoacid initiator and 0.05 to 6% of sensitizing dye). Additionally, the coatings may contain from 2 to 50% by weight of colored dyes or pigments (e.g., cyan, magenta, yellow or black) to provide a color proofing image.

Monomers

The monomeric component of the present invention comprises a free radical polymerizable compound having at least two ethylenically unsaturated groups, and preferably at least 2 to 4 ethylenically unsaturated groups selected from the groups consisting of acrylate, methylacrylate, vinyl and allyl. Preferred are compounds having multiple acrylate and methacrylate groups, e.g., acrylic esters of low molecular weight polyols, such as trimethylolpropanetriacrylate, pentaerythritol tetraacrylate and triacrylate, etc. Preferably these monomers have a molecular weight of less than 2,000 and more preferably less than 1,000.

Suitable free radical polymerizable monomers useful in the compositions of the invention are well known and listed in many patents, e.g., U.S. Pat. Nos. 3,895,949 and 4,037,021. Preferred monomers are the polyacrylate and polymethacrylate esters of alkanepolyols, e.g., pentaerythritol tetraacrylate, tris(2-acryloxyethyl)isocyanurate, tris(2-methyacryloxyethyl)isocyanurate, 2-acetoxyethyl methacrylate, tetrahydrofurfurylmethacrylate, 1-aza-5-acryloxymethyl-3, 7-dioxabicyclo [3.0.0] octane (ADOZ) bis[4-(2-acryloxyethylphenyl]dimethyl methane, diacetone acrylamide, and acrylamidoethyl methacrylate.

Initiator

The compositions of the present invention must also have a radiation sensitive system capable of photogenerating acids and of initiating free radical polymerization upon absorption of radiation. Free radical initiators are materials known in the art, such as *Free-Radical Chemistry*, D. C. Nonhebel and J. C. Walton, University Press (1974). Particularly suitable photoacid generating free radical generators can be selected from many classes of organic compounds including, for example, aromatic iodonium salts, aromatic sulfonium salts, aromatic phosphonium salts, triarylimidazoles, biimidazoles, chloroalkyltriazines, s-triazines, etc. These materials, in general, must have photosensitizers therewith to form a photoinitiator system. Photosensitizers are well known in the art.

Additional reference in the art to free radical photoinitiator systems for ethylenically unsaturated compounds are included in U.S. Pat. No. 3,887,450 (e.g., column 4), U.S. Pat. No. 3,895,949 (e.g., column 7), and U.S Pat. No. 4,043,819. Preferred initiators are the onium salts as disclosed in U.S. Pat. Nos. 3,729,313; 4,058,400; and 4,058,401. Other desirable initiators are biimidazoles (disclosed in U.S. patent application Ser. No. 824,733, filed Aug. 15, 1977) and chloroalkyltriazines as disclosed in U.S. Pat. No. 3,775,113. These references also disclose sensitizers therein. Another good reference to photoinitiator system is *Light-Sensitive Systems*, J. Kosar, 1965, J. Wiley and Sons, Inc., especially Chapter 5.

Oligomers and Polymers

A reactive polymer is defined in the practice of the present invention as any polymeric material having at least two polymerizable groups thereon and having a molecular weight greater than that of the monomer component. Preferably the molecular weight of the reactive polymer is sufficiently high that it is a film forming polymer by itself. This is generally indicated by a molecular weight of at least 2,000. It is also desirable that the reactive polymer swell in aqueous alkaline developer having a pH of 7.5 or greater. Combinations of reactive polymers are particularly desirable in tailoring the properties of the photosensitive layer. Swellability of one component emphasizes ease of developability in aqueous alkaline solution. Non-swellability of another reactive polymer component will contribute to the cohesiveness of the photosensitive layer during development. By balancing the proportions of swellable and non-swellable reactive polymer, one can provide whatever balance of ease of developability and cohesive strength that is necessary for particular product needs.

The oligomeric or polymeric component of the present invention comprises a free radical polymerizable oligomer having an ethylenically unsaturated group equivalent weight of between 45 and 5000 and being of a higher molecular weight than said monomer. Preferred oligomers are shown in U.S. Pat. No. 4,304,923 as urethane oligomers.

A generic structural formula for the urethane oligomers can be drawn as follows:

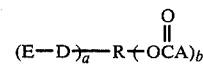

wherein
E is an ethylenically unsaturated, free radical polymerizable group, preferably selected from acryloyloxyalkoxy (alternatively named acryloxyalkoxy), methacryloylalkoxy (alternatively named methacryloxyalkoxy), vinylalkoxy, and allyloxy,
D is the residue of a polyisocyanate (preferably a diisocyanate) having at least two of its $-N=C=O$ groups reacted to form

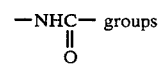

D bonding E to R,
A is a carboxylic acid containing group (e.g.,

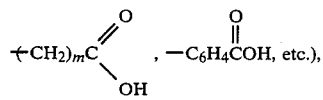

a is a number having an average value between 2 and 20,
b is a number having an average value between 0.3 and 10, and
m=1 to 6,
R is the residue of a polyol having at least a+b hydroxyl groups and a number of average molecular weight between 90 and 10,000, the residue formed by removal of hydrogen from the hydroxyl groups.

The backbone of the oligomer, group R, may be any aromatic or aliphatic polyol having a molecular weight between 90 and 10,000. The backbone of the oligomer may be any oligomer with the requisite molecular weight and number of hydroxyl groups, but polyester-polyols and polyoxyalkylene polyols are preferred. Linear oligomeric polyols are useful but the branched or three-dimensional polyols such as polycaprolactone polyols are preferred. The backbone may be prepared by any of the many well known methods of forming polyhydroxyl substituted oligomers having a molecular weight between 90 and 10,000. The polyols must have a hydroxy equivalent weight of between 45 and 5,000 to be useful according to the present invention. Preferably the polyol has a hydroxy equivalent weight between 90 and 4,000 and most preferably between 200 and 2,000.

The oligomers backbone may be homopolymeric, copolymeric, graft polymeric, or mixtures thereof. For example, polycaprolactone polyols may be used, or lower molecular weight polycaprolactone polyols (average molecular weights of less than, for example, 500) may be joined by polyacids (preferably dicarboxylic acids) or by polyisocyanates (preferably diisocyanates) to form higher molecular weight oligomer backbones.

Other useful reactive polymers include the reaction of a styrene-maleic anhydride copolymer and hydroxyethylmethacrylate. That reaction is effected by simply heating the two materials in a non-reactive solvent. An example of a particularly useful class of non-swellable reactive binders is acrylate functional cellulose esters. A preferred example of that class is the reaction product of cellulose acetate proprionate and isocyanatoethylmethacrylate.

Binders

The binder component of the present invention comprises an organic, polymeric thermoplastic binder having a molecular weight of at least 1,000 which is preferably not reactive with the polymerization mechanism of the monomer or oligomer. To be non-reactive with the oligomer and monomer, the binder must be able to pass the following test: 5 grams of the candidate binder, 3 grams of pentaerythritol tetraacrylate, 0.4 grams of diphenyliodonium hexafluoroantimonate and 0.4 grams of 4,4'-bis(dimethylamino) benzophenone sensitizing dye are dissolved in organic solvents (e.g., methylethylketone, isopropanol, ethylacetate, n-propanol/water azotrope, and mixtures thereof), and then irradiated for 15 seconds to a carbon arc having a 5,000 watt output at a distance of about 1 meter. If at least 90% by weight of the binder can be separated from the polymerized acrylate by leaching or other differentinate and 0.4 grams of 4,4,'-bis(dimethylamino) benzophenone sensitizing dye are dissolved in organic solvents (e.g., methylethylketone, isopropanol, ethylacetate, n-propanol/water azotrope, and mixtures thereof), and then irradiated for 15 seconds to a carbon arc having a 5,000 watt output at a distance of about 1 meter. If at least 90% by weight of the binder can be separated from the polymerized acrylate by leaching or other differential solvent techniques, the binder is non-reactive according to the teachings of the present invention.

The binders preferably should be heat-softenable between 100° and 400° F. (38° C. to 205° C.). It is also particularly useful to the present invention that the binder not be soluble in at least one solution selected from the class consisting of aqueous alkaline solutions at a pH of 9.0 (e.g., water and NaOH), aqueous alcohol solutions (e.g., water and n-propanol, 80/20 blend), and organic solutions (e.g., toluene/ethyl acetate, 50/50 blend). The inability of the binder to be solubilized by at least one of these solutions assists in preserving desired properties during the development process. If the binder is not solubilizing and leached from the polymerized areas, its desirable thermoplastic properties will be preserved in the polymerized image areas, enable subsequent transfer. The most preferred binders in the practice of the present invention are polyketones. Lower molecular weight acrylates and polyesters are also useful.

A particulary useful aspect of the present invention is that the sensitizing dyes of the present invention have a singularly unique capability of being leached from highly crosslinked polymeric systems by the action of aqueous, aqueous alkaline and aqueous alcohol developers in a short period of time. This is highly advantageous because in imaging systems residual or background staining from the sensitizing dye is greatly reduced because so much of the dye is removed from the system. In preferred systems, more than 50% of the dye can be leached from a fully polymerized composition (more than 90% of all available photopolymerizable groups are reacted) by mild sembling for two minutes with at least one solution selected from the group consisting of pure water, aqueous alkaline solutions at pH 9.0 (with NaOH and sufficient snyjactant to enable surface welling of the polymer by the solution), and aqueous alcohol solutions (e.g. 80/20, water/n-propanol). Preferably more than 75% of the dye can be leached out without destruction of the structural integrity of the polymerized mass. Most preferably more than of the sensitizing dye can be thus removed.

These and other aspects of the present invention will be shown in the following non-limiting examples.

EXAMPLE 1

The following coating solution was made by mixing:
25 gms pentaerythritrol tetraacrylate
15 gms oligomer described in U.S. Pat. No. 4,304,923 (Preparation II)
15 gms of a polyketone resin (Lawter 1717B)
6.75 gms $OI_2PF_6$ (diphenyliodonium hexafluorophosphate)
2.00 gms (p-dimethylaminobenzyl acetone)
200 gms a 5% Regal 300 Carbon (Cabot) black dispersion made by ball milling the carbon black in a glass jar with glass marbles in 112 trichloroethane solvent. This dispersion also contained 1% poly(vinyl formal) as a dispersing aid.
800 gms 112 trichloroethane This solution was coated on a polyester film subbed with a polyurea resin to provide a black photopolymer layer having an optical density of 0.70 as measured by white light transmission. The coating was dried in an oven for 1 minute at 70° C. The dry coating was overcoated with a polyvinyl alcohol topcoat at a coating weight of 70 mgs/ft² by using a water solution of 5% Monsanto Gelvatol 20–30. The solution also contained 0.5% by weight Rohm & Haas X-200 wetting agent.

The above coated film was contact exposed with a photographic negative, then developed with a 1.5% sodium hydroxide solution containing 0.2% by weight Rohm & Haas Triton X-100 wetting agent, rinsed with water and air dried.

A thermal adhesive coated paper was prepared by coating a 10 percent by weight solution of low molecular weight polyester resin dissolved in MEK onto 3M Matchprint Commercial Negative proofing paper. The dried coating weight was 1.0 gms/ft$^2$ after the MEK had evaporated.

The developed film was placed with its image side in contact with the thermal adhesive on the paper and laminated using the heated rolls of a 3M Model 447 proofing laminator. The roll set temperatures were 240° F. for the top roll and 150° for the bottom roll. The laminating speed was 20 inches/minute.

When the laminate had cooled, the polyester film was peeled from the paper, leaving the black image embedded in the thermoplastic.

Additional coating solutions were made in yellow, magenta and cyan

Using as pigments in place of the carbon black
CI pigment yellow 14 (CI #21095) (Sun)
CI pigment red 23 (CI #12355) (Heubach)
Sun pigment blue 248 0061 (Sun Chemical Co.)

Coated film of black, cyan, magenta and yellow were prepared as above.

Using a set of lithographic separation negatives, a complete set of black, cyan, magenta and yellow images were exposed in a contact frame (Berkey-Ascor 30×40), developed, and laminated in register to form a four color proof.

Result: The proof was found to be contaminated with dye stain. Post exposure of the proof for 10 minutes in the contact frame did not produce a white background or unstained colors.

Conclusion: The sensitizing dye of this example (p-dimethylaminobenzyl acetone) is a member of the aminoketone class of sensitizing dyes described in U.S. Pat. No. 3,729,313. Its performance is satisfactory except for a yellow brown dye stain.

EXAMPLE 2

The experiment of Example 1 was repeated except that the films were postexposed prior to lamination. Although the color of the paper was less yellow-brown than the previous example, the stain was still objectionable.

EXAMPLE 3

The text of Example 1 was performed using acridine orange in place of the aminoketone dye of Example 1. Unsatisfactory dye stain was again obtained. Photobleaching still did not completely remove the stain.

EXAMPLE 4

Preparation of 3,5-bis[N-(2-carboxyethyl)-1,2,3,4-tetrahydro-6-quinolylidene]1-acetal-4-piperidone.

I. To 133 g (1.0 mole) of 1,2,3,4-tetrahydroquinoline was added 86 g (1.0 mole) methyl acrylate in a stirred reaction flask. 10 g of acetic acid was added and the mixture heated to reflux for 18 hours. The resulting liquid was distilled through a Vigeraux column. Product distilled at 140°–150° C., 0.5 mm Hg. Yield=192 g (87.5%).

II. 463 g (6.3 moles) of dry DMF was stirred in a 3-neck reaction vessel, kept under a nitrogen atmosphere, and then cooled with an ice bath to 5° C. 268 g (1.75 mole) phosphorous oxychloride were dropwise added, keeping the temperature below 20° C. Stirring was continued for 1 hour after completing the addition. 384 g (1.75 mole) of n-(2-carboxy(—)ethyl)-1,2,3,4-tetrahydroquinoline (from first step) was added dropwise to the cooled reaction mixture, keeping the temperature below 30° C. Upon completion of the addition, the reaction mixture was carefully heated to 100° C., and held there for 1½ hours.

The solution was cooled to room temperature and the reaction mixture poured over 2 liters of ice water while stirring well with a mechanical stirrer. Sodium bicarbonate was added slowly with good agitation until the pH was neutral. The reaction mixture was extracted with 3×1 liter chloroform, and the combined organics washed with 1 liter of a saturated solution of sodium bicarbonate, then twice with 1 liter of water. The organics were dried with magnesium sulfate, the mixture filtered and concentrated using a rotary evaporator. The remaining DMF was stripped using a vacuum pump. Yield was of a very dark, thick oil, 360 g (83%).

III. 200 g (0.8 mole) of n-(1-carboxyethyl)-1,2,3,4-tetrahydroquinoline-6-carboxaldehyde (from second step) was mixed with 57.5 g (0.4 mole) of 1-acetyl-4-piperidone and 2.5 liters acetic acid. This stirred mixture was cooled to 5° C. and 127 ml (2.4 mole) concentrated sulfuric acid was added dropwise. The stirred reaction mixture was allowed to warm to room temperature and stirred for 3 days.

This reaction mixture was poured over a combination of 2 liters ice in 6 liters water while stirring well. A 50% solution of NaOH was carefully added while maintaining the temperature below 40° C. with external cooling. When the pH reached 6–7, the liquid portion of the mixture was decanted off. To the remaining gum was added two liters of ethyl acetate. This was heated to reflux and scratched, cooled, and the solid filtered onto a Buchner. To this solid was added 2 liters acetone, and the mixture heated to reflux with good mixing and scratching, then cooled. The solid was filtered onto a Buchner, and oven dried. Yield=85 g (36%) of a dark solid. $\lambda max(CHCH_3)=464$ nm.

This dye was used in the formulation of Example 1 to provide a four color proof. In the formulation, 4.0 gms of this dye were used in place of the 2.0 gms of the aminoketone of Example 1 to maximize photographic speed.

Results: No dye stain was seen in the proof. Post exposure was unnecessary. This demonstrates the excellent results of the dyes of this invention.

EXAMPLE 5

The dye

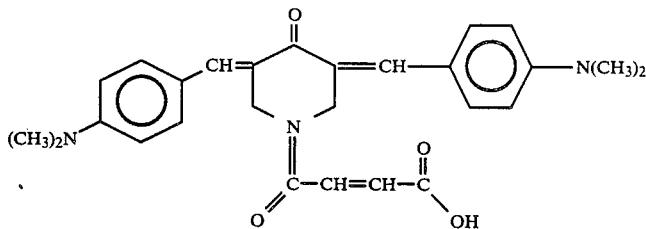

was prepared using the common base catalyzed condensation technique using p-dimethyl amino benzaldehyde and 4-piperidone hydrochloride.

A flask was charged with the following:
100 gms NaOH
100 gms piperidone HCl
250 gms dimethylaminobenzaldehyde
2 liters ab. ethanol The NaOH was dissolved in the EtOH prior to addition of the components. The flask was heated with good mixing at 65° for six hours. The resulting dye was filtered with a 24 cm Buchner and washed several times with EtOH. This dye was dried in a forced air oven overnight at 30° C. to remove the remaining EtOH.

The dry intermediate was then reacted with maleic anhydride.
100 gms dye
1 liter dry tolune (AR grade)
100 gms maleic anhydride This mixture was heated at 85° C. for three hours during which a thioxotropic slurry formed.

The dye was then filtered with the Buchner and dispersed in two liters of water. The slurry was stirred for one hour at room temperature and the pH adjusted to 4.0-4.5. The dye was filtered for the last time and dried overnight at 30° C. λmax=460 nm.

The dye of this example was used in the formulation of Example 1 where 30 gms of dye replaced the 20 gms of the dye of the first example to maximize photographic speed.

Results: Some dye remained in the imaged and developed films, but this minor amount was easily bleached with light. Thus a proof with a white background and uncontaminated colors could be made.

EXAMPLE 6

The dye

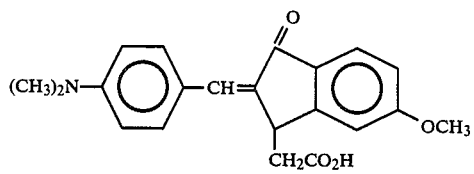

λmax = 416nm (CHCH3)

was made using the appropriate reagents in a modification of the procedure of Example 5. In the formulations of Example 1, this dye did not stain and thus no postexposure bleaching was necessary.

We claim:

1. A photopolymerizable system comprising
10-60% by weight of an ethylenically unsaturated polyfunctional monomer,
10-60% by weight of an ethylenically unsaturated polyfunctional polymer,
10-60% by weight of a polymeric binder, and
0.1-20% by weight of a photoinitiator system comprising a tertiary amino aryl ketone dye having at least one carboxylic acid group thereon and a free radical photoinitiator selected from the group consisting of photoacid generating free radical photoinitiator and a biimidazole and
wherein said dye has the formula:

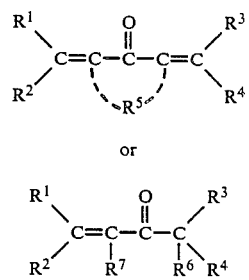

wherein
$R^1$, $R^2$, $R^3$, $R^4$ and $R^6$ are independently selected from the group consisting of hydrogen, alkyl, aryl, and 5- or 6-membered heterocyclic rings containing on C, N, S, Se, or O ring atoms,
$R^5$ represents the atoms necessary to complete a 5-, 6-, 7-membered heterocyclic ring having only C, N, S, Se, and O atoms therein, with no more than 2 ring atoms being other than C, and,
at least one of $R^1$, $R^2$, $R^3$, $R^4$, $R^5$, $R^6$ and $R^7$ has a carboxylic and group thereon and at least one of $R^1$, $R^2$, $R^3$, $R^4$ and $R^6$ is an aromatic group having a dialkylamino, diarylamino, or alkylaryl amino substituent.

2. The system of claim 1 wherein all ring atoms are limited to C and N.

3. The system of claim 1 wherein alkyl groups have 1 to 4 carbon atoms and aromatic groups comprise phenyl.

4. The system of claim 2 wherein alkyl groups have 1 to 4 carbon atoms and aromatic groups comprise phenyl.

5. The photopolymerizable system of claim 1 wherein said ethylenically unsaturated monomer and polymer (1) comprise polyacryloyl and polymethacryloyl monomer and (2) polyacryloyl and polymethylacryloyl polymers and sufficient colorant to provide a transmission optical density of at least 0.3 at a dry coating weight of 25 mg/m².

6. The photopolymerizable system of claim 5 wherein said photoinitiator is selected from the group consisting of photosensitive iodonium salts, photosensitive sulfonium salts, s-triazines.

7. The system of claim 1 further comprising 2–50% by weight of a colorant selected from the class consisting of pigment and dye.

8. A photopolymerizable system comprising

10–60% by weight of an ethylenically unsaturated polyfunctional monomer,

10–60% by weight of an ethylenically unsaturated polyfunctional polymer,

10–60% by weight of a polymeric binder, and 0.1–20% by weight of a photoinitiator system comprising a tertiary amino aryl ketone dye having at least one carboxylic acid group thereon and a free radical photoinitiator selected from the group consisting of photoacid generating free radical photoinitiator and a biimidazole, and wherein said ethylenically unsaturated monomer and polymer (1) comprise polyacryloyl and polymethacryloyl monomer and (2) polyacryloyl and polymethylacryloyl polymers and sufficient colorant to provide a transmission optical density of at least 0.3 at a dry coating weight of 25 mg/m$^2$ and wherein said photoacid generating free radical photoinitiator is selected from the group consisting of photosensitive iodonium salts, photosensitive sulfonium salts, and s-triazines.

9. The photopolymerizable system of claim 8 wherein said polymeric binder is non-reactive with the polymerization of acryloyl and methacryloyl groups.

10. The photopolymerizable system of claim 9 wherein said polymeric binder comprises polyketone resin.

* * * * *

UNITED STATES PATENT AND TRADEMARK OFFICE
CERTIFICATE OF CORRECTION

PATENT NO. : 4,755,450

DATED : July 5, 1988

INVENTOR(S) : Sanders and Olson

It is certified that error appears in the above-identified patent and that said Letters Patent is hereby corrected as shown below:

Column 2, line 37 "O-membered" should be -- 6-membered --.

Signed and Sealed this

Thirty-first Day of October, 1989

Attest:

DONALD J. QUIGG

*Attesting Officer*     *Commissioner of Patents and Trademarks*